United States Patent
Duan et al.

(10) Patent No.: US 12,382,596 B2
(45) Date of Patent: Aug. 5, 2025

(54) FOLDABLE LED DISPLAY SCREEN

(71) Applicant: SHENZHEN CLT ELECTRONICS CO., LTD, Shenzhen (CN)

(72) Inventors: Sicai Duan, Shenzhen (CN); Jie Huang, Shenzhen (CN); Yong Li, Shenzhen (CN); Li Peng, Shenzhen (CN)

(73) Assignee: SHENZHEN CLT ELECTRONICS CO., LTD., Shenzhen (CN)

( * ) Notice: Subject to any disclaimer, the term of this patent is extended or adjusted under 35 U.S.C. 154(b) by 244 days.

(21) Appl. No.: 18/359,616

(22) Filed: Jul. 26, 2023

(65) Prior Publication Data

US 2025/0040069 A1    Jan. 30, 2025

(51) Int. Cl.
*H05K 5/02* (2006.01)
*F16C 11/04* (2006.01)

(52) U.S. Cl.
CPC .......... *H05K 5/0226* (2013.01); *F16C 11/045* (2013.01)

(58) Field of Classification Search
CPC ....................................................... G06F 1/16
See application file for complete search history.

(56) References Cited

U.S. PATENT DOCUMENTS

| | | | | |
|---|---|---|---|---|
| 2020/0043388 A1* | 2/2020 | Hicks | ............... | G09F 19/227 |
| 2021/0034117 A1* | 2/2021 | Torres | .................. | E05D 3/06 |

FOREIGN PATENT DOCUMENTS

| | | |
|---|---|---|
| CN | 106128322 A | 11/2016 |
| CN | 107791932 A | 3/2018 |
| CN | 208384912 U | 1/2019 |
| CN | 208806021 U | 4/2019 |
| CN | 209183158 U | 7/2019 |
| CN | 110825169 A | 2/2020 |
| CN | 111010520 A | 4/2020 |
| CN | 211956970 U | 11/2020 |
| CN | 213241754 U | 5/2021 |
| CN | 213458791 U | 6/2021 |
| CN | 113539077 A | 10/2021 |
| CN | 215007285 U | 12/2021 |

(Continued)

OTHER PUBLICATIONS

First Office Action issued in counterpart Chinese Patent Application No. 202210211852.X, dated Nov. 29, 2023.

(Continued)

*Primary Examiner* — Jerry Wu
(74) *Attorney, Agent, or Firm* — Westbridge IP LLC

(57) ABSTRACT

A foldable LED display screen includes a first display screen, a second display screen, and a hinge. The hinge includes a first hinge block, a second hinge block, a first connecting piece, and a second connecting piece. The first hinge block embedded in the first connecting end without protruding from the first connecting end, the second hinge block embedded in the second connecting end without protruding from the second connecting end. One end of the first connecting piece is slidably connected to the first hinge block, and another end of the first connecting piece is hinged to the second hinge block. One end of the second connecting piece is slidably connected to the second hinge block, and another end of the second connecting piece is hinged to the first hinge block. The second connecting piece is hinged with the first connecting piece through the hinge shaft.

11 Claims, 14 Drawing Sheets

(56) References Cited

FOREIGN PATENT DOCUMENTS

| | | |
|---|---|---|
| CN | 114038335 A | 2/2022 |
| CN | 114842743 A | 8/2022 |
| KR | 20220019545 A | 2/2022 |
| TW | M489217 U | 11/2014 |

OTHER PUBLICATIONS

Fourth Office Action issued in counterpart Chinese Patent Application No. 202210211852.X, dated Dec. 31, 2024.
Second Office Action issued in counterpart Chinese Patent Application No. 202210211852.X, dated Jun. 2, 2024.
Third Office Action issued in counterpart Chinese Patent Application No. 202210211852.X, dated Sep. 30, 2024.

* cited by examiner

FOLDABLE LED DISPLAY SCREEN

TECHNICAL FIELD

The present application relates to the technical field of light emitting diode (LED) display screens, and in particular to a foldable LED display screen.

BACKGROUND

Existing LED display screens are troublesome to transport, difficult to carry, and time-consuming to assemble and debug due to their large size. Due to the difficulties in manufacturing and installation of large-sized LED screens, when the LED screen is to be transferred, it needs to be disassembled before installation, and after installation, it needs to be re-tested, which consumes a lot of manpower and time. If you want to transfer directly without dismantling the whole screen, the whole LED screen is inconvenient to enter the narrow space, especially the elevator. Therefore, there are many foldable LED display screen available on the market. They mainly include outward-foldable LED display screen and inward-foldable LED display screens. However, the outward-foldable LED display screens cannot protect the module well; they are prone to contact with external objects and easily damaged. Moreover, the folding mechanism is located outside of the screen body, so the integrity is not strong.

SUMMARY

The main objective of the present application is to provide a foldable light emitting diode (LED) display screen, which aims at reducing the risk of damaging the display screen and enhance the integrity of the display screen.

The present application discloses a foldable LED display screen, including: a first display screen including a first connecting end; a second display screen including a second connecting end; and a hinge, including: a first hinge block embedded in the first connecting end without protruding from the first connecting end; a second hinge block embedded in the second connecting end without protruding from the second connecting end; a first connecting piece, one end of the first connecting piece being slidably connected to the first hinge block, another end of the first connecting piece being hinged to the second hinge block; and a second connecting piece, one end of the second connecting piece being slidably connected to the second hinge block, another end of the second connecting piece being hinged to the first hinge block, a middle part of the second connecting piece being connected to a middle part of the first connecting piece through a hinge shaft, when the first hinge block and the second hinge block are unfolded, both the first connecting piece and the second connecting piece are completely accommodated in the first hinge block and the second hinge block, so that the first connecting end is attached to the second connecting end.

According to the embodiments of the present application, the foldable LED display screen possesses at least the following technical effect: reducing the risk of damaging the display screen, and enhancing the integrity of the display screen.

In an embodiment, a first groove is provided on the first hinge block, a first hinge shaft is provided at one end of the first connecting piece, and the first hinge shaft is provided in the first groove, so that one end of the first connecting piece is slidably connected to the first hinge block.

In an embodiment, a second groove is provided on the first hinge block, a second hinge shaft is provided at one end of the second connecting piece, and the second hinge shaft is provided in the second groove, so that one end of the second connecting piece is slidably connected to the second hinge block.

In an embodiment, the first connecting piece is provided with a first arm and a second arm, the first arm is integrally formed with the second arm, the first arm and the second arm are rotatably connected to the hinge shaft, and an angle between the first arm and the second arm is greater than 90°.

In an embodiment, the second connecting piece is provided with a third arm and a fourth arm, the third arm is integrally formed with the fourth arm, a connecting part between the third arm and the fourth arm is rotatably connected to the hinge shaft, and an angle between the third arm and the fourth arm is greater than 90°.

In an embodiment, the first connecting end is provided with a first adsorption piece, the second connecting end is provided with a second adsorption piece, and when the first display screen and the second display screen are unfolded, the first adsorption piece is adsorbed to the second adsorption piece.

In an embodiment, the foldable LED display screen further includes a fixing piece, the first display screen is fixed to the second display screen through the fixing piece.

In an embodiment, at least one of the first connecting end and the second connecting end is provided with a buffer.

In an embodiment, a positioning structure is provided between the first connecting end and the second connecting end, so that the first display screen is fixed to the second display screen.

In an embodiment, one of the first connecting end and the second connecting end is provided with a positioning column, and another one of the first connecting end and the second connecting end is provided with a positioning pin adapted to the positioning column.

In an embodiment, a locking structure is provided between the first connecting end and the second connecting end.

DETAILED DESCRIPTION OF THE EMBODIMENTS

Figure 1:
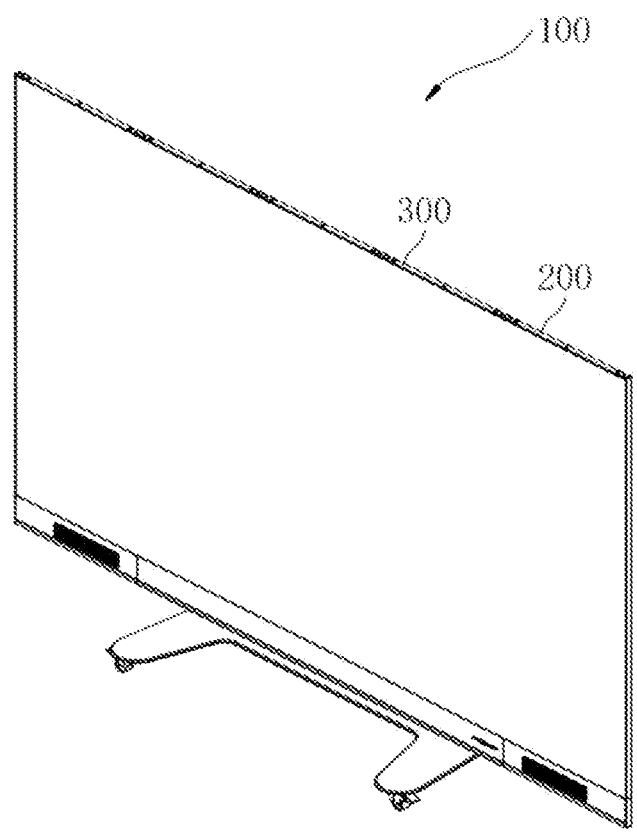
FIG. 1 is a perspective view before folding a foldable light emitting diode (LED) display screen of the present application.

Embodiments of the present application are described in detail below, examples of which are shown in the drawings, the same or similar reference signs designate the same or similar elements or elements possessing the same or similar functions throughout. The embodiments described below by the figures are exemplary only for explaining the present application and should not be construed as limiting the present application.

In the description of the present application, it should be understood that the orientation descriptions, such as up, down, front, rear, left, right, etc. indicated orientations or positional relationships are based on the orientations or positional relationships shown in the drawings, and are only in order to facilitate the description of the present application and simplify the description. It does not indicate or imply that the device or element referred to must possess a specific orientation, be constructed and operated in a specific orientation, and thus should not be construed as limiting the present application.

In the description of the present application, a plurality of means one or more, and multiple means more than two. Greater than, less than, exceeding, etc. are understood as not including the original quantity, and above, below, within, etc. are understood as including the original quantity. If the description of the first and second is only for the purpose of distinguishing the technical features, it cannot be understood as indicating or implying the relative importance or implicitly indicating the quantity of the indicated technical features or implicitly indicating the order of the indicated technical features relation.

In the description of the present application, unless otherwise clearly defined, words such as setting, installation, and connection should be understood in a broad sense, and those skilled in the art can reasonably determine the specific meanings of the above words in the present application in combination with the specific content of the technical solution.

As shown in FIG. 1 to FIG. 11, the present application provides a foldable light emitting diode (LED) display screen 100, including: a first display screen 200, a second display screen 300 and a hinge 400. The first display screen 200 includes a first connecting end 201; the second display screen 300 includes a second connecting end 301; the hinge 400 includes a first hinge block 401, a second hinge block 402, a first connecting piece 404 and a second connecting piece 405. The first hinge block 401 is embedded in the first connecting end 201 without protruding from the first connecting end 201, the second hinge block 402 is embedded in the second connecting end 301 without protruding from the second connecting end 301. One end of the first connecting piece 404 is slidably connected to the first hinge block 401, and another end of the first connecting piece is hinged to the second hinge block 402. One end of the second connecting piece 405 is slidably connected to the second hinge block 402, and another end of the second connecting piece 405 is hinged to the first hinge block 401, and the middle part of the second connecting piece 405 (between the two ends of the second connecting piece 405) and the middle part of the first connecting piece 404 (between the two ends of the first connecting piece 404) are hinged to each other through a hinge shaft 403. When the first hinge block 401 and the second hinge block 402 are unfolded, both the first connecting piece 404 and the second connecting piece 405 are completely accommodated in the first hinge block 401 and the second hinge block 402, so that the first connecting end 201 is attached to the second connecting end 301.

Figure 9:
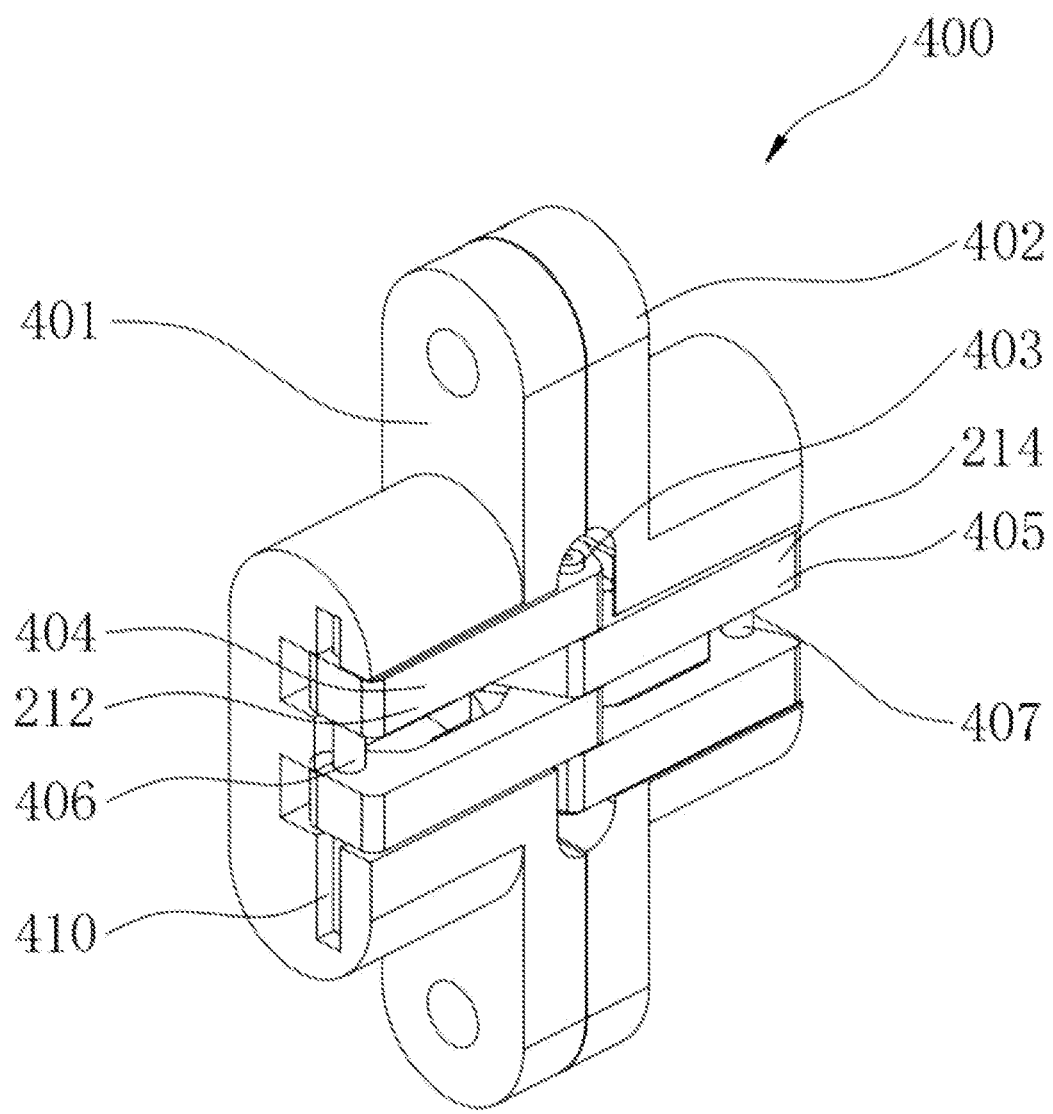
FIG. 9 is a perspective view after unfolding the hinge of the present application.

The "when the first hinge block 401 and the second hinge block 402 are unfolded" refers to the closed state of the first hinge block 401 and the second hinge block 402, which is shown in FIG. 9.

According to an embodiment of the present application, the risk of damaging the display screen is reduced, and the integrity of the display screen is enhanced. Specifically, large-size LED display screens will cause a lot of inconvenience during transportation and handling, especially during transportation, they may not be able to enter the elevator due to their large size, which requires the LED display screen to be folded or disassembled before assembling. However, many LED display screens are now folded outwards, which makes the LED display screen module easy to touch with other objects in the process of transportation, resulting in damage. Besides, the folding device is exposed, and the integrity is not strong. However, the method of disassembling and then reassembling makes the operation complicated and consumes a great deal of manpower and time.

Therefore, this embodiment provides a foldable LED display 100, including: a first display screen 200, a second display screen 300 and a hinge 400. The first display screen 200 includes a first connecting end 201; the second display screen 300 includes a second connecting end 301; the hinge 400 includes a first hinge block 401, a second hinge block 402, a first connecting piece 404 and a second connecting piece 405. The first hinge block 401 is embedded in the first connecting end 201 without protruding from the first connecting end 201, the second hinge block 402 is embedded in the second connecting end 301 without protruding from the second connecting end 301. One end of the first connecting piece 404 is slidably connected to the first hinge block 401, and the other end of the first connecting piece 404 is hinged to the second hinge block 402. One end of the second connecting piece 405 is slidably connected to the second hinge block 402, and the other end of the second connecting piece 405 is hinged to the first hinge block 401, and the middle part of the second connecting piece 405 (between the two ends of the second connecting piece 405) and the middle part of the first connecting piece 404 (between the two ends of the first connecting piece 404) are hinged to each other through a hinge shaft 403. When the first hinge block 401 and the second hinge block 402 are unfolded, both the first connecting piece 404 and the second connecting piece 405 are completely accommodated in the first hinge block 401 and the second hinge block 402, so that the first connecting end 201 is attached to the second connecting end 301 to enhance the integrity of the display screen.

Figure 8:
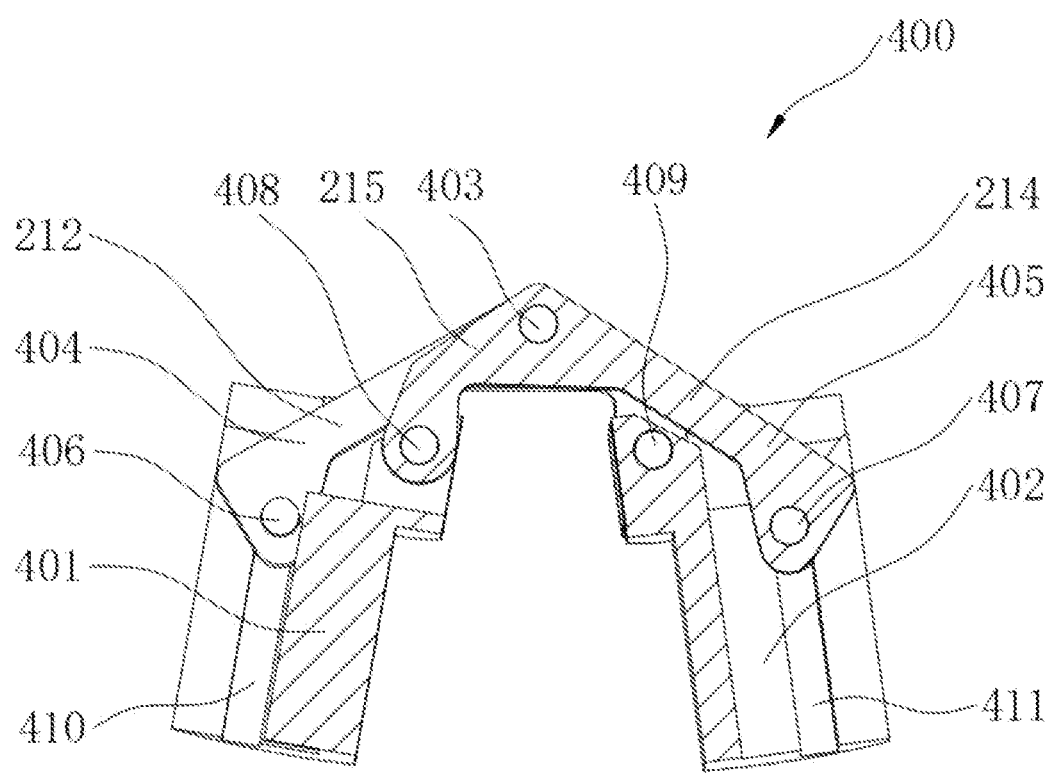
FIG. 8 is a cross-sectional view along A-A in FIG. 7.

As shown in FIG. 8 and FIG. 9, the first hinge block 401 is provided with a first groove 410, and one end of the first connecting piece 404 is provided with a first hinge shaft 406, and the first hinge shaft 406 is provided in the first groove 410, so that one end of the first connecting piece 404 is slidably connected to the first hinge block 401. The second hinge block 402 is provided with a second groove 411, and one end of the second connecting piece 405 is provided with a second hinge shaft 407, and the second hinge shaft 407 is provided in the second groove 411, so that one end of the second connecting piece 405 is slidably connected to the second hinge block 402. Therefore, the first hinge block 401 and the second hinge block 402 are folded, thereby realizing the inward folding of the first display screen 200 and the second display screen 300.

In an embodiment, the other end of the first connecting piece 404 is hinged to the second hinge block 402 through the fourth hinge shaft 409, and the other end of the second connecting piece 405 is hinged to the first hinge block 401 through the third hinge shaft 408.

As shown in FIG. 7, FIG. 8, FIG. 9, FIG. 2, FIG. 3 and FIG. 4, the first connecting piece 404 is provided with a first arm 212 and a second arm 213, and the first arm 212 is integrally formed with the second arm 213. The first arm 212 and the second arm 213 are rotatably connected to the hinge shaft 403, and the angle between the first arm 212 and the second arm 213 is greater than 90°. The second connecting piece 405 is provided with a third arm 214 and a fourth arm 215, and the third arm 214 is integrally formed with the fourth arm 215. A connecting part between the third arm 214 and the fourth arm 215 is rotatably connected to the hinge shaft 403, and the angle between the third arm 214 and the fourth arm 215 is greater than 90°. Specifically, the first connecting piece 404 can be a "V"-shaped structure, and the second connecting piece 405 can also be a "V"-shaped structure. When the first display screen 200 and the second display screen 300 are folded, the angle between the first display screen 200 and the second display screen 300 is greater than 0°, so that the screen of the first display screen 200 is away from the screen of the second display screen 300 to prevent the first display screen 200 and the second display screen 300 from colliding, and the risk of damaging the first display screen 200 and the second display screen 300 is reduced.

In an embodiment, the foldable LED display screen 100 may include the plurality of hinges 400.

In an embodiment, the foldable LED display screen 100 further includes a fixing piece 500, and the first display screen 200 is fixed to the second display screen 300 through the fixing piece 500.

Figure 2:
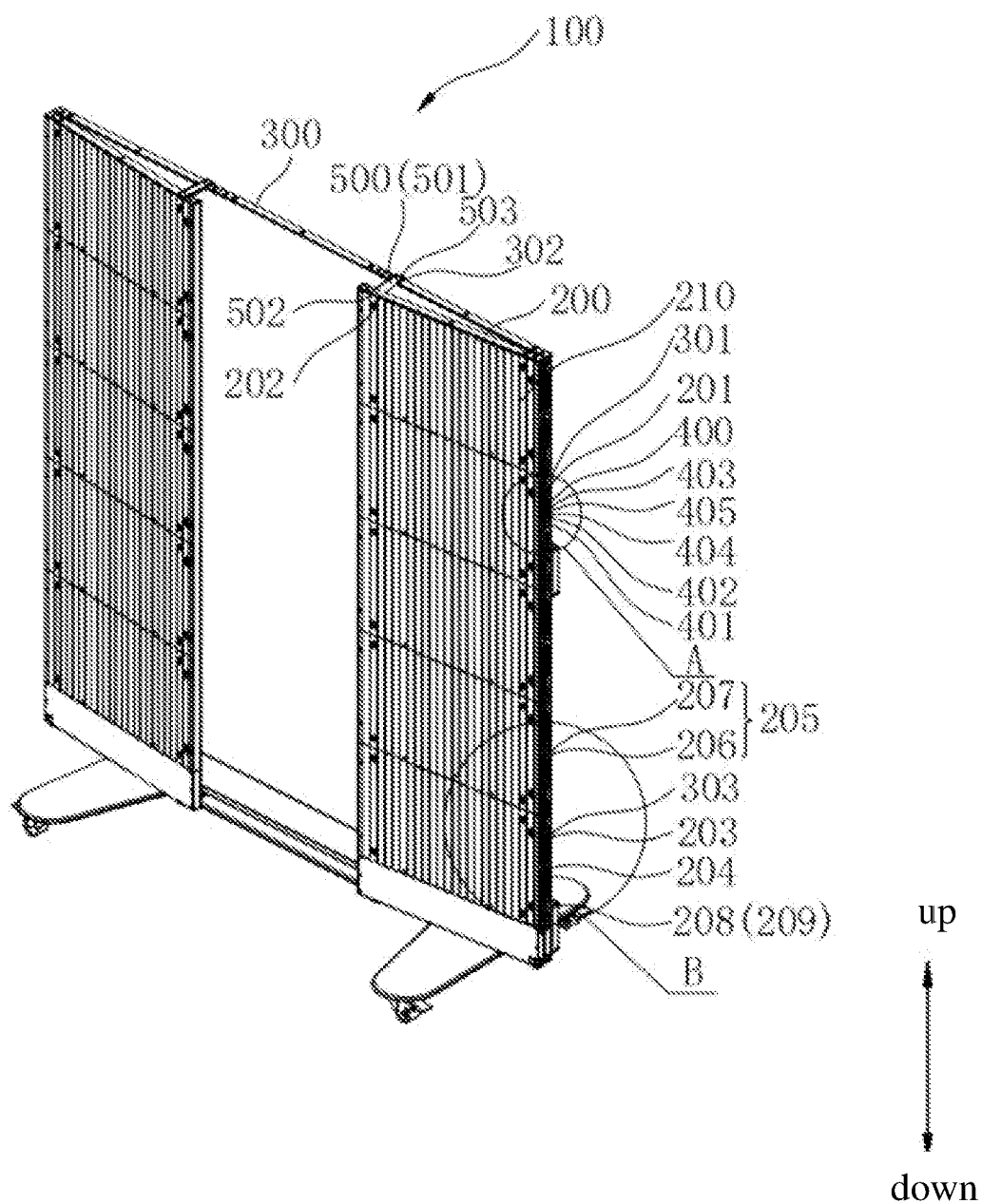
FIG. 2 is a perspective view after folding the foldable LED display screen of the present application.
Figure 5:
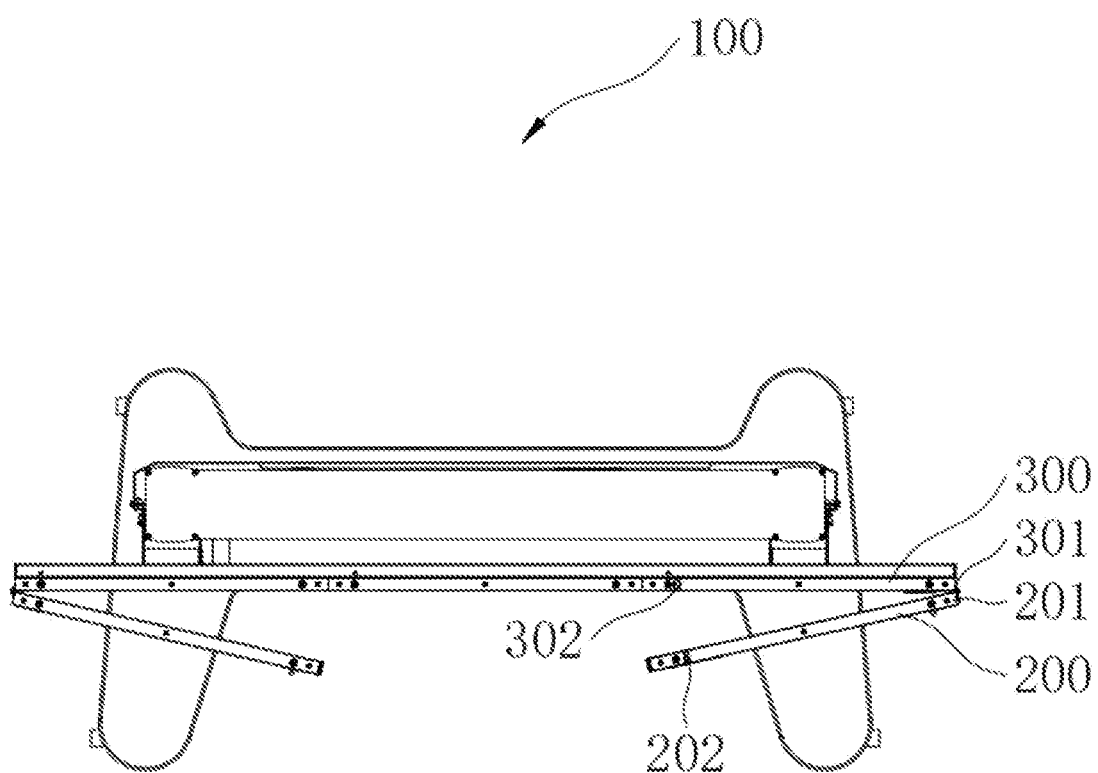
FIG. 5 is a top view after folding the foldable LED display screen of the present application.
Figure 6:
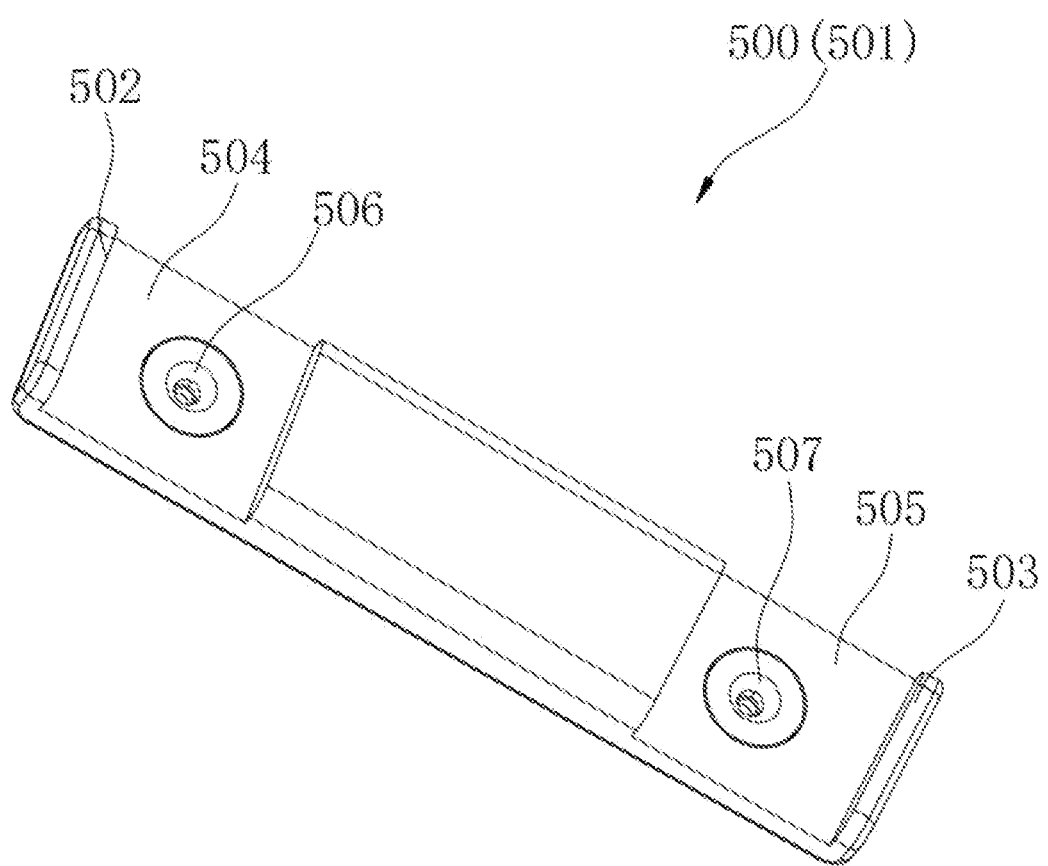
FIG. 6 is a perspective view of a fixing block of the present application.

As shown in FIG. 2, FIG. 5 and FIG. 6, the fixing piece 500 is a fixing block 501, the fixing block 501 includes a first fixing end 502 and a second fixing end 503, at least one edge of the first display screen 200 is provided with the first connecting part 202 connected to the first fixing end 502, and one edge of the second display screen 300 is provided with the second connecting part 302 connected to the second fixing end 503. The first fixing end 502 is provided with the third groove 504 matching with the first connecting part 202, and the second fixing end 503 is provided with the fourth groove 505 matching with the second connecting part 302.

In an embodiment, the first connecting part 202 is a part of the edge of the first display screen 200, and the second connecting part 302 is a part of the edge of the second display screen 300. Specifically, when the first display screen 200 and the second display screen 300 are folded, the third groove 504 of the first fixing end 502 of the fixing block 501 is fastened to the first connecting part 202 of the first display screen 200. The fourth groove 505 of the second fixing end 503 of the fixing block 501 is fastened to the second connecting part 302 of the second display screen 300 to fix the first display screen 200 and the second display screen 300 to reduce the risk of damaging the display screen, and make it convenient to transport and handle.

As shown in FIG. 6, FIG. 2 and FIG. 5, one of the first fixing end 502 and the first connecting part 202 is provided with a first magnet 506, and another one of the first fixing end 502 and the first connecting part 202 is provided with a magnetic adsorption structure adapted to the first magnet 506. One of the second fixing end 503 and the second connecting part 302 is provided with a second magnet 507, and another one of the second fixing end 503 and the second connecting part 302 is provided with a magnetic adsorption structure adapted to the second magnet 507. Specifically, the first fixing end 502 is provided with a first magnet 506, and the first connecting part 202 is a magnetic adsorption structure adapted to the first magnet 506, or the first fixing end 502 is a magnetic adsorption structure, and the first connecting part 202 is provided with a first magnet 506 adapted to the magnetic adsorption structure. The second fixing end 503 is provided with a second magnet 507, and the second connecting part 302 is a magnetic adsorption structure adapted to the second magnet 507, or the second fixing end 503 is a magnetic adsorption structure, the second connecting part 302 is provided with a second magnet 507 adapted to the magnetic adsorption structure. Specifically, when the first display screen 200 and the second display screen 300 are folded, the first fixing end 502 of the fixing block 501 is fixed to the first connecting part 202 of the first display screen 200 by a magnetic adsorption structure, and the second fixing end 503 of the fixing block 501 is fixed to the second connecting part 302 of the second display screen 300 through a magnetic adsorption structure, so that the first display screen 200 and the second display screen 300 do not shake, thereby reducing the risk of damaging the display screens, and facilitating transportation and handling.

In an embodiment, the first fixing end 502 is provided with a first magnet 506, and the second fixing end 503 is provided with a second magnet 507, and the first connecting part 202 may be a fifth magnet with a magnetic pole opposite to the first magnet 506. The second connecting part 302 can also be a sixth magnet with a magnetic pole opposite to the second magnet 507.

Figure 2A:
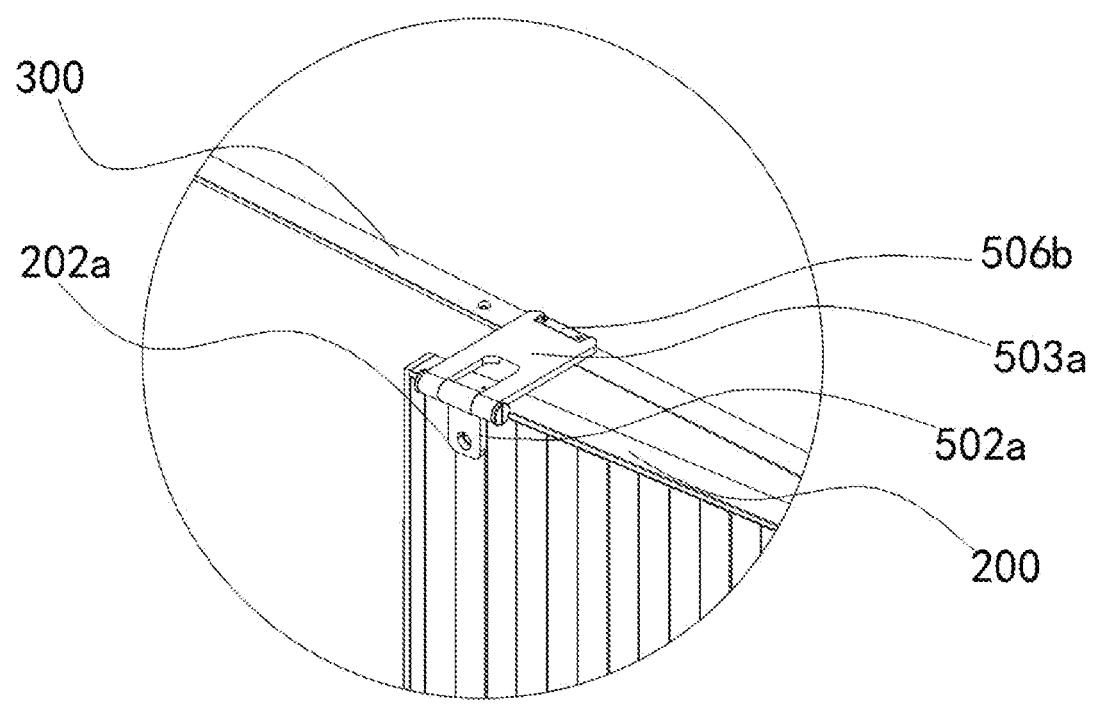
FIG. 2A is a partial perspective view after folding the foldable LED display screen according to another embodiment of the present application.
Figure 5A:
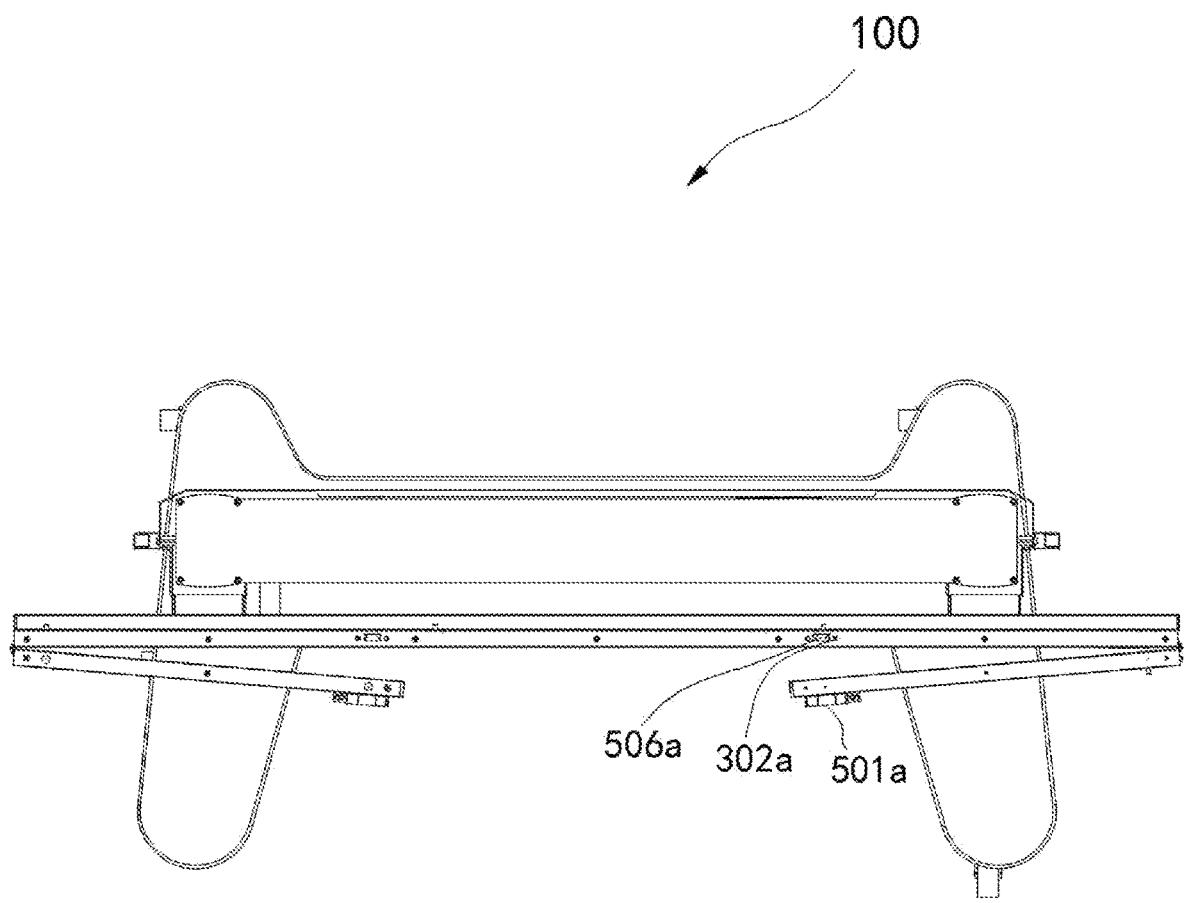
FIG. 5A is a top view after folding the foldable LED display screen according to another embodiment of the present application.
Figure 6A:
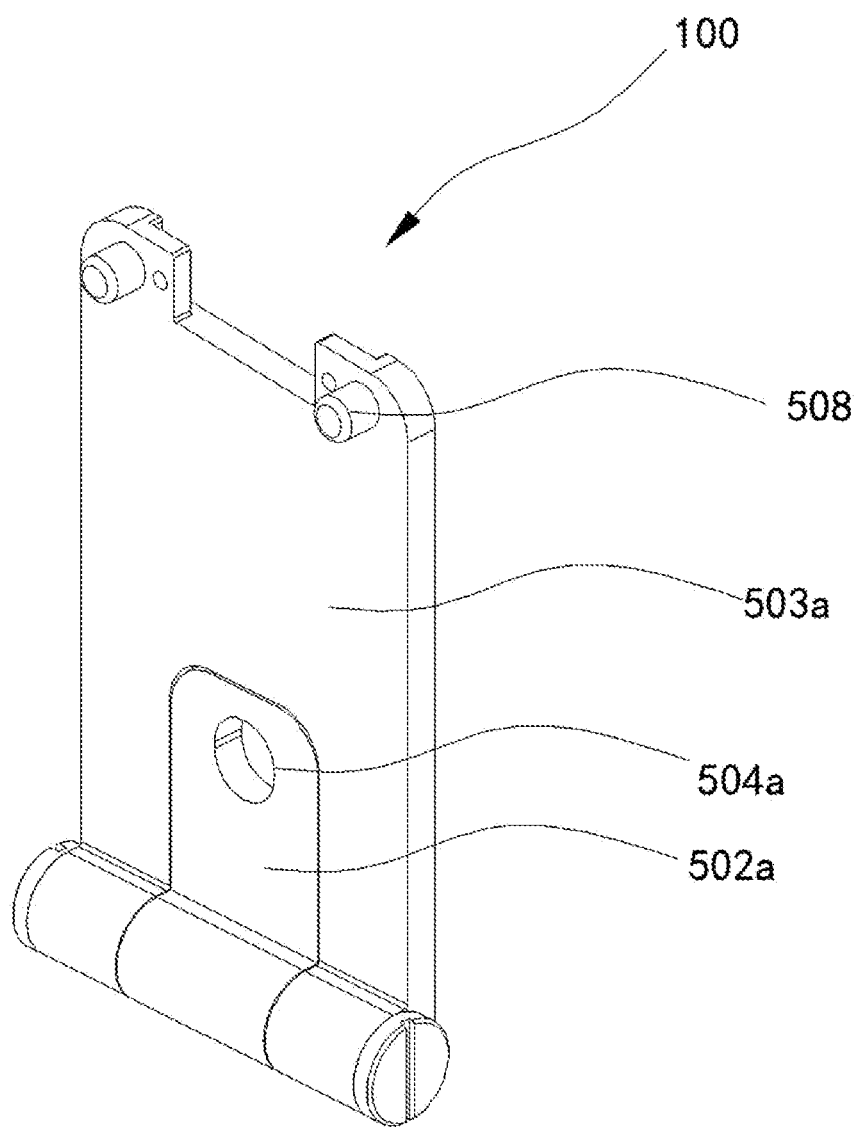
FIG. 6A is a perspective view of a fixing hinge according to another embodiment of the present application.
Figure 7:
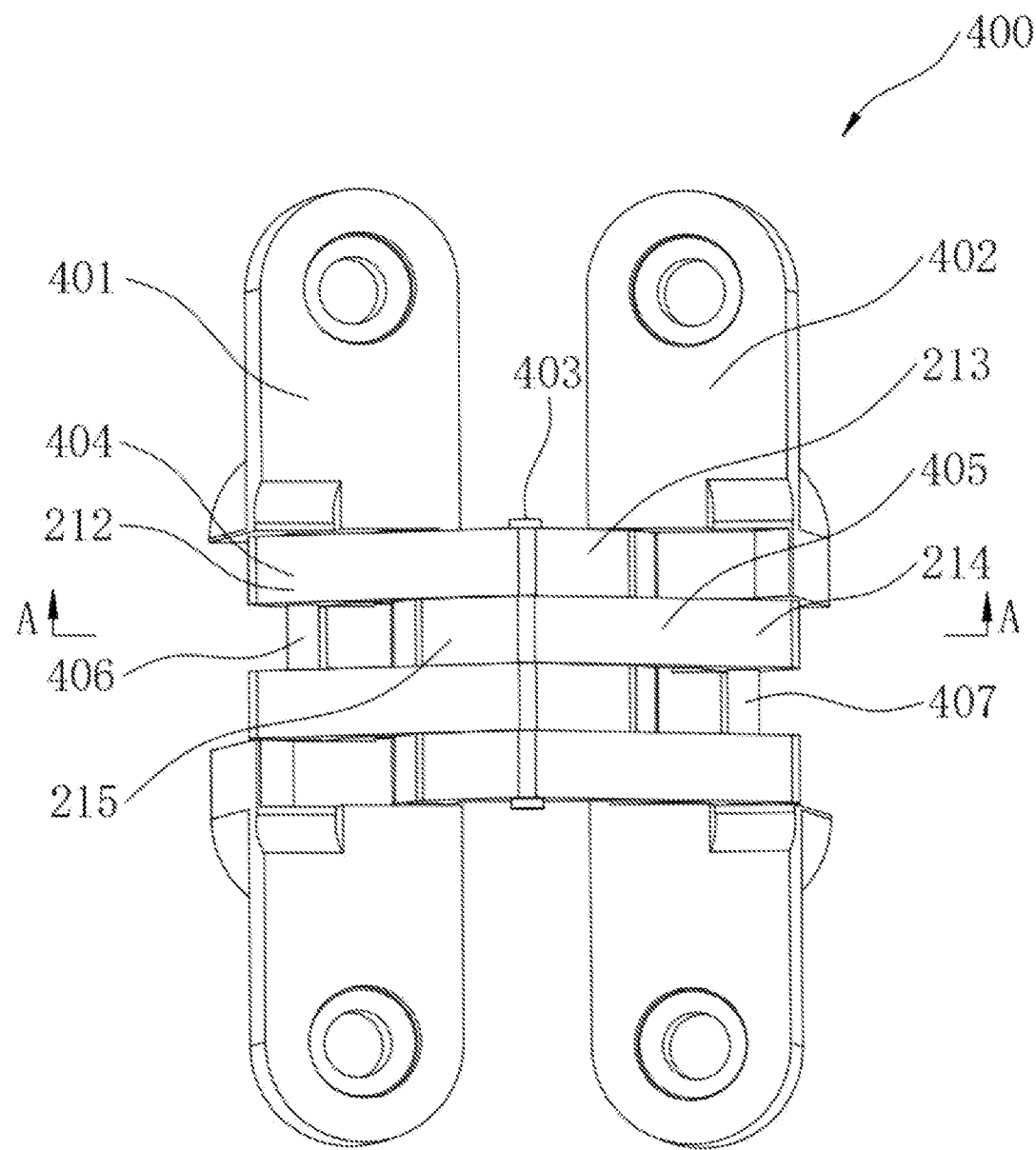
FIG. 7 is a front view of a hinge of the foldable LED display screen of the present application.

As shown in FIG. 2A, FIG. 5A and FIG. 6A, the fixing piece 500 can also be a fixing hinge 501*a*. The fixing hinge 501*a* includes a first fixing part 502*a* and a second fixing part 503*a* hinged by a rotating shaft. The first box 210 corresponding to at least one edge of the first display screen 200 is provided with a first connecting part 202*a* connected to the first fixing part 502*a*. The first connecting part 202*a* can be a screw hole opened on the surface of the first box 210, and the second connecting part 302*a* may be two pin holes. The second box 310 corresponding to the edge of the second display screen 300 is provided with a second connecting part 302*a* connected to the second fixing part 503*a*. The first fixing part 502*a* is provided with a through hole 504*a* matching the first connecting part 202*a*. A surface of the second fixing part 503*a* is further provided with a fixing pin 508 matching the second connecting part 302*a* along a direction away from the rotating shaft. The first fixing part 502*a* is connected to the first connecting part 202*a* by bolts.

A notch is provided on one end edge of the second fixing part 503*a* in a direction away from the rotating shaft, and a groove is provided on the other surface opposite to the surface where the two fixing pins 508 are located. The width of the groove is greater than the width of the notch, and the groove is matched with the notch. A first fixing magnet 506*a* is also fixed between the two pin holes of the second connecting part 302*a*, and the groove is used for fixing and installing a second fixing magnet 506*b* matched with the first fixing magnet 506*a*. Specifically, the first fixing magnet 506*a* and the fixing magnet 506*b* attract each other to form a magnetic attraction structure. When the first display screen 200 and the second display screen 300 are folded, the first fixing part 502*a* of the fixing hinge 501*a* and the first connecting part 202*a* of the first display screen 200 are fixed by screws, and the second fixing part 503*a* of the fixing hinge 501*a* and the second connection portion 302*a* of the second display screen 300 are connected by the magnetic attraction structure. At this time, the notch is used to avoid the fixing magnet 506*a*, the fixing pin 508 is inserted into the pin hole, so that the first display screen 200 and the second display screen 300 do not shake, which reduces the risk of damaging the display screen, and facilitates transportation and handling.

Figure 3:
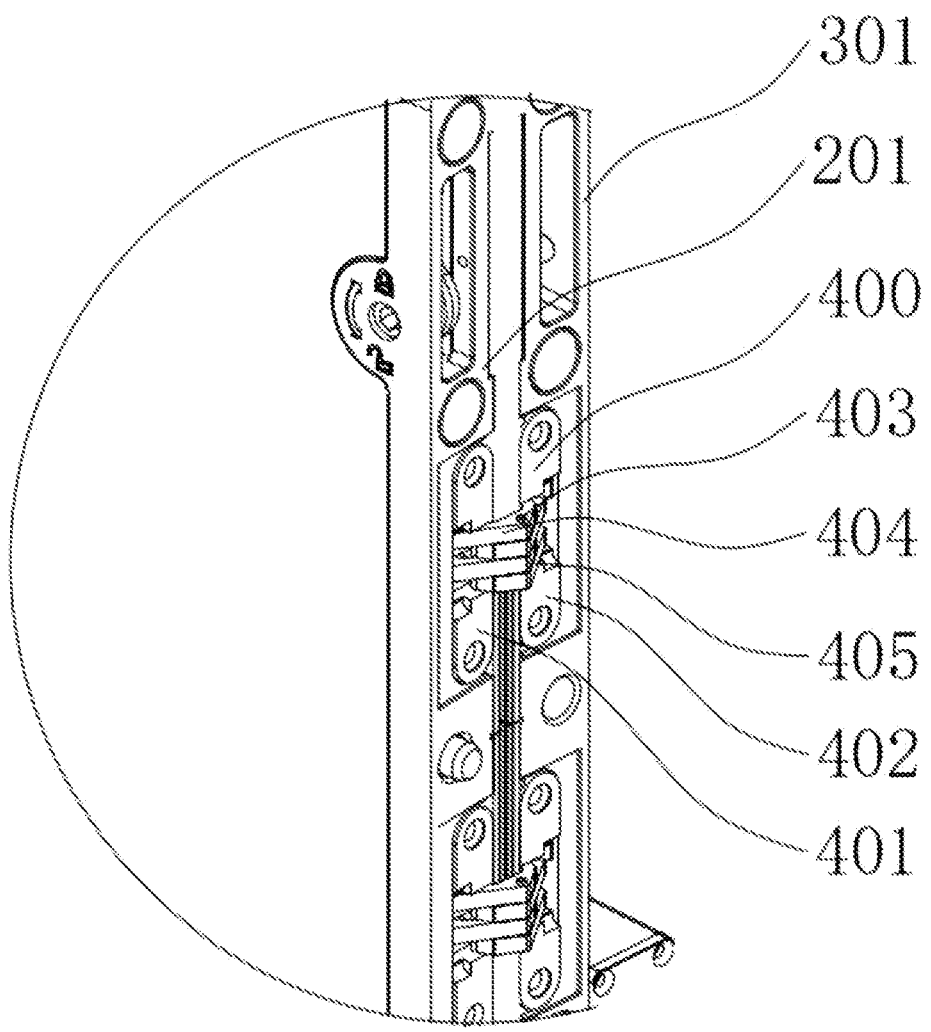
FIG. 3 is an enlarged view of A in FIG. 2.
Figure 4:
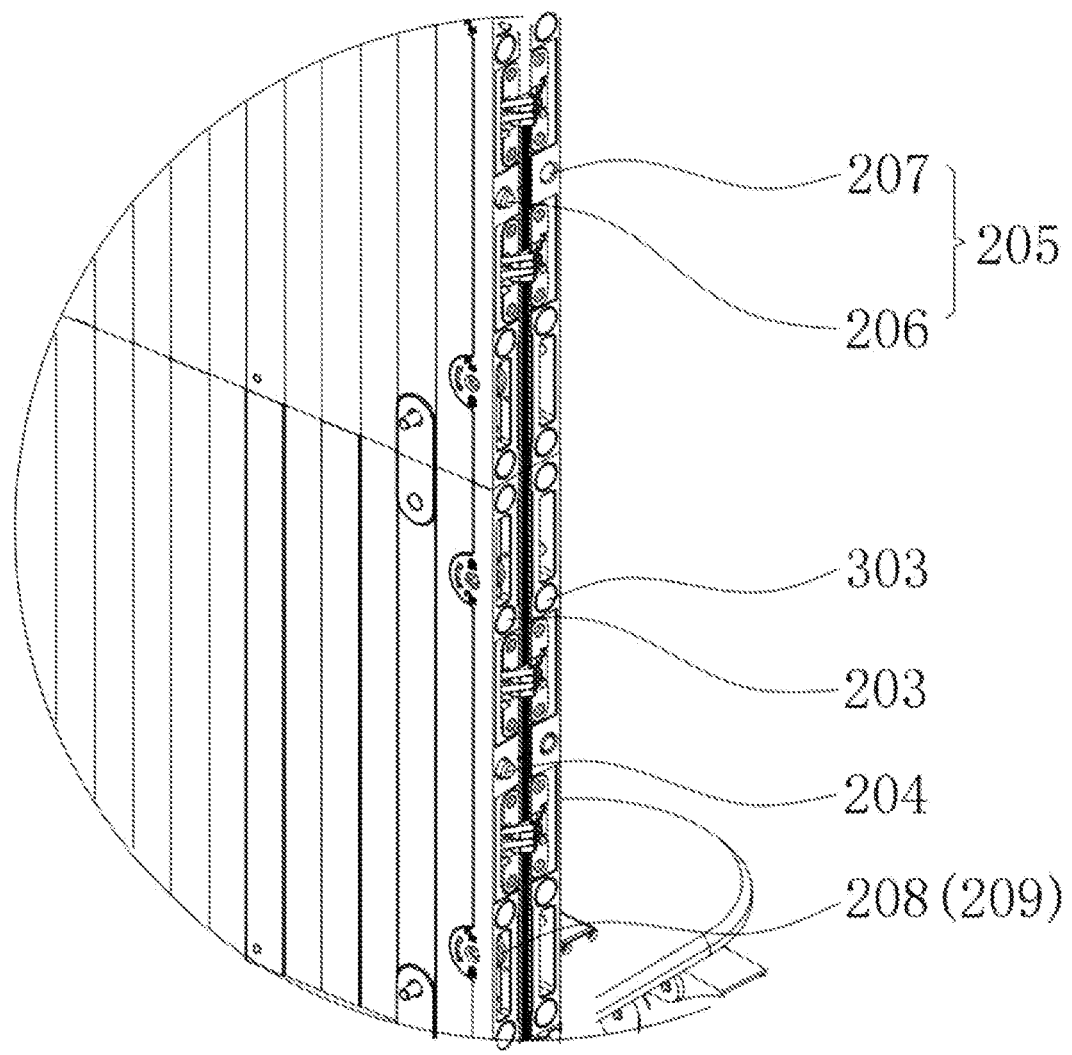
FIG. 4 is an enlarged view of B in FIG. 2.

As shown in FIG. 2, FIG. 3 and FIG. 4, the first connecting end 201 is provided with a first adsorption piece 203, the second connecting end 301 is provided with a second adsorption piece 303, when the first display screen 200 and the second display screen are unfolded, the first adsorption piece 203 is adsorbed to the second adsorption piece 303 Specifically, the first adsorption piece 203 can be a third magnet, and the second adsorption piece 303 can be a fourth magnet with a magnetic pole opposite to the third magnet. When the first display screen 200 and the second display screen 300 are unfolded, the third magnet is adsorbed to the fourth magnet, so that the first display screen 200 and the second display screen 300 are unfolded, thereby fixing the first display screen 200 and the second display screen 300.

Figure 10:
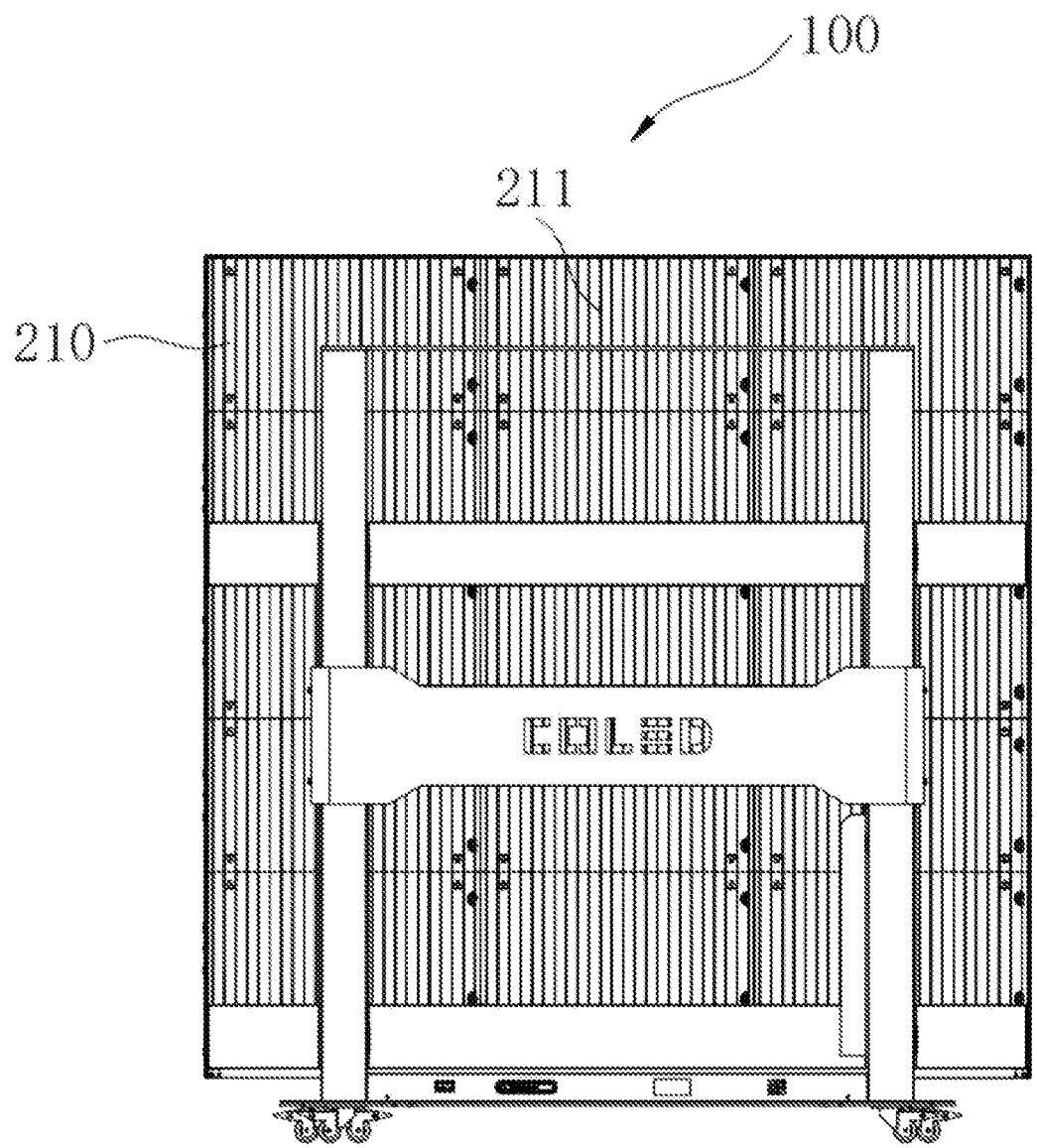
FIG. 10 is a rear view before folding the foldable LED display screen of the present application.

As shown in FIG. 2 and FIG. 10, the first display screen 200 includes a plurality of first boxes 210, the second display screen 300 includes a plurality of second boxes 211, and the first connecting end 201 is formed by the sides of the plurality of first boxes 210. The second connecting end 301 is formed by the sides of a plurality of second boxes 211, the sides of the first box 210 correspond to the sides of the second boxes 211, and two hinges 400 are provided between each first box 210 and the corresponding second box 211, so that the first display screen 200 can be folded toward the second display screen 300, or the second display screen 300 can be folded toward the first display screen 200.

In an embodiment, the first connecting end 201 is composed of the sides of five first box 210 sequentially provided up and down, and the second connecting end 301 is composed of the sides of five second boxes 211 with the same height as the first box 210. The sides of each first box 210 correspond to the sides of each second box 211, and the two hinges 400 are provided between each first box 210 and the corresponding second box 211, which facilitates the folding of the first display screen 200 and the second display screen 300, and also makes the folding process more stable.

As shown in FIG. 2 and FIG. 4, at least one of the first connecting end 201 and the second connecting end 301 is provided with a buffer 204. Specifically, when the first display screen 200 and the second display screen 300 are unfolded, due to a strong adsorption force generated by the first adsorption piece 203 and the second adsorption piece 303, the first connecting end 201 is collided with the second connecting end 301, and the buffer 204 of the first connecting end 201 can avoid the damage to the display screen caused by the collision of the first connecting end 201 and the second connecting end 301.

In an embodiment, the first connecting end 201 is composed of the sides of five first box 210 sequentially provided up and down, and the second connecting end 301 is composed of the sides of five second boxes 211 with the same height as the first box 210. The side of the box 211, the buffer 204 is arranged on the side of the first box 210 of the first, third, fifth row, etc. of the first connecting end 201.

In an embodiment, the above buffer 204 is a hydraulic buffer 204.

As shown in FIG. 2 and FIG. 4, a positioning structure 205 is provided between the first connecting end 201 and the second connecting end 301, so that the first display screen 200 is fixed to the second display screen 300. Specifically, the first connecting end 201 is provided with a positioning column 206, and the second connecting end 301 is provided with a positioning pin 207 adapted to the positioning column 206 of the first connecting end 201. In an embodiment, the second connecting end 301 is provided with the positioning column 206, and the first connecting end 201 is provided with a positioning pin 207 adapted to the positioning column 206 of the second connecting end 301, so that the first display screen 200 and the second display screen 300 skip shifting, and are better fixed.

In an embodiment, the first connecting end 201 is composed of the sides of five first box 210 sequentially provided up and down, and the second connecting end 301 is composed of the sides of five second boxes 211 with the same height as the first box 210. The positioning column 206 is provided at the side of the first box 210 on the second and fourth rows of the first connecting end 201, and the sides of the second box 211 on the second, fourth and sixth rows of the second connecting end 301 is provided with a positioning pin 207 corresponding to the positioning column 206.

As shown in FIG. 2 and FIG. 4, a locking structure 208 is provided between the first connecting end 201 and the second connecting end 301. When the first display screen 200 and the second display screen 300 are unfolded, the first display screen 200 is fixed to the second display screen 300 to prevent the first display screen 200 and the second display screen 300 from shaking and avoid damage to the first display screen 200 and the second display screen 300. Specifically, the locking structure 208 may be an eagle hook lock 209 including a first locking structure and a second locking structure. The first locking structure of the eagle hook lock 209 is embedded in the first connecting end 201 without protruding from the first connecting end 201. The second locking structure of the eagle hook lock 209 is embedded in the second connecting end 301 without protruding from the second connecting end 301. The first display screen 200 and the second display screen 300 can be fixed through the first locking structure and the second locking structure, thereby reducing the risk of damaging the display screen and enhancing the integrity of the display screen.

In an embodiment, two locking structures 208 are provided between the two ends at the sides of the first box 210 and the two ends at the sides of the second box 211, and the two hinges 400 of each box are provided between the two locking structures 208.

Figure 11:
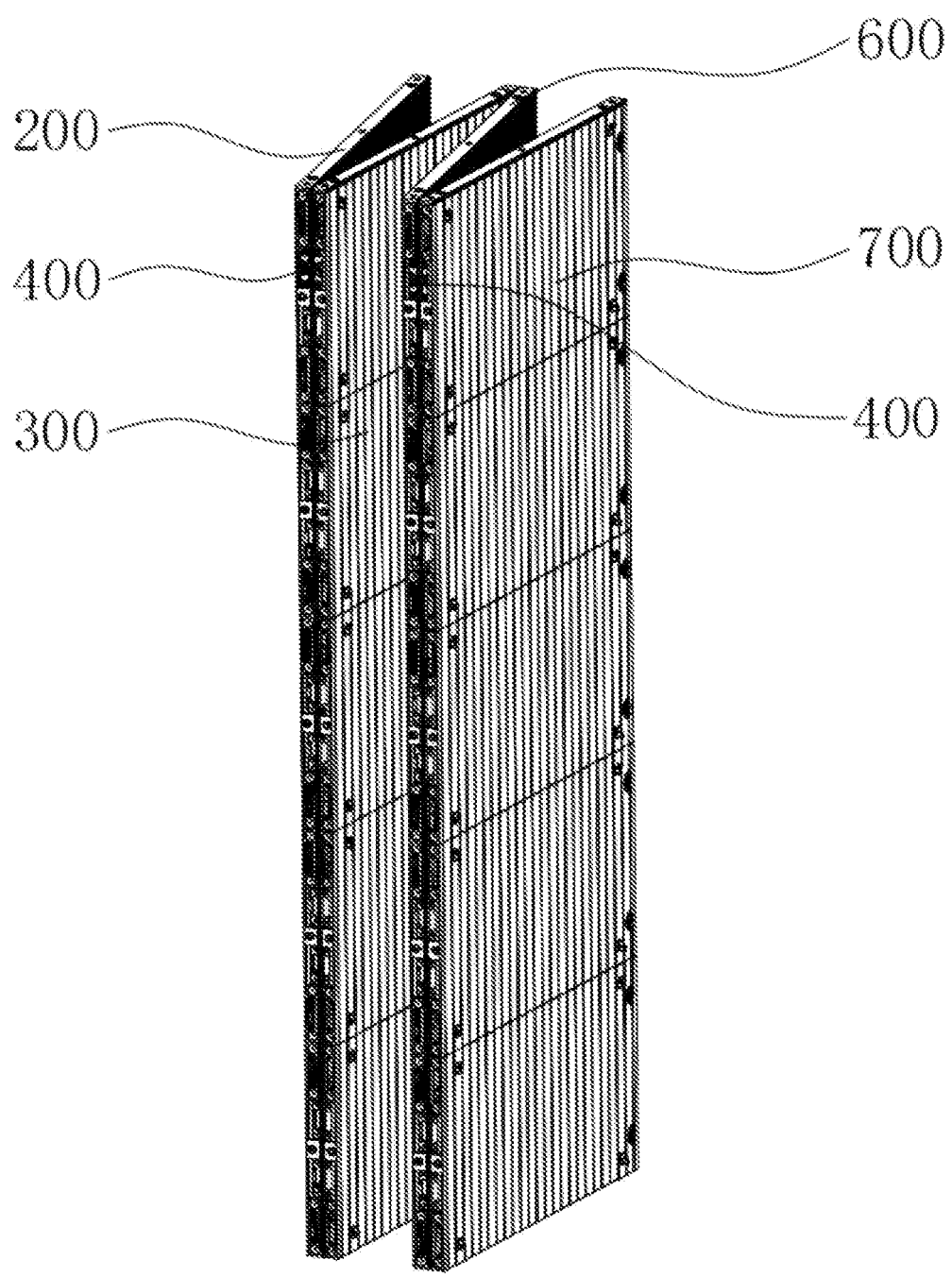
FIG. 11 is a schematic view of combining an inward and an outward foldable LED display screen of the present application.

As shown in FIG. 11, a third display screen 600 and a fourth display screen 700 may further be provided. The first hinge block 401 of the hinge 400 is embedded in the first connecting end 201 of the first display screen 200, and the second hinge block 402 of the hinge 400 is embedded in the second connecting end 301 of the second display screen 300. The other connecting end of the second display screen 300 opposite to the second connecting end 301 of the second display screen 300 can be connected to the connecting end of one end of the third display screen 600 by reversely installing the hinge 400, so that the third display screen 600 can be reversely folded toward the second display screen 300, that is, the third display screen 600 and the second display screen 300 can be folded outwardly, and the connecting end of the other end of the third display screen 600 is connected to the connecting end of one end of the fourth display screen 700 through the hinge 400. The inward folding of the third display screen 600 and the fourth display screen 700 is realized, thereby combining the inward and outward folding of the display screen, and reducing the risk of damaging the display screen thus strengthening the display screen integrity.

In an embodiment, the foldable LED display screen 100 may further includes a fifth display screen, and a sixth display screen, etc.

In the description of this specification, references to the terms "one embodiment", "some embodiments", "exemplary embodiments", "example", "specific examples", or "some examples" are intended to mean that specific feature, structure, material, or characteristic described by an embodiment or example is included in at least one embodiment or example of the present application. In this specification, schematic representations of the above terms do not necessarily refer to the same embodiment or example. Furthermore, the specific features, structures, materials or characteristics described may be combined in any suitable manner in any one or more embodiments or examples.

Although the embodiments of the present application have been shown and described, those skilled in the art can understand that various changes, modifications, substitutions and modifications can be made to these embodiments without departing from the principle and spirit of the present application. The scope of the present application is defined by the claims and their equivalents. The above are only some embodiments of the present application, not to limit the scope of the present application. Any equivalent structural transformation made by using the content of the specification of the present application and the drawings under the inventive concept of the present application, or direct/indirect application in other related technical fields are included in the scope of the present application.

What is claimed is:

1. A foldable light emitting diode (LED) display screen, comprising: a first display screen comprising a first connecting end; a second display screen comprising a second connecting end; and a hinge, comprising: a first hinge block embedded in the first connecting end without protruding from a front surface of the first connecting end; a second hinge block embedded in the second connecting end without protruding from a front surface of the second connecting end; a first connecting piece, one end of the first connecting piece being slidably connected to the first hinge block, another end of the first connecting piece being hinged to the second hinge block; and a second connecting piece, one end of the second connecting piece being slidably connected to the second hinge block, another end of the second connecting piece being hinged to the first hinge block, a middle part of the second connecting piece being hingedly connected to a middle part of the first connecting piece through a hinge shaft, wherein when the first hinge block and the second hinge block are unfolded, both the first connecting piece and the second connecting piece are completely accommodated in the first hinge block and the second hinge block, so that the front surface of the first connecting end is attached to the front surface of the second connecting end.

2. The foldable LED display screen according to claim 1, wherein a first groove is provided on the first hinge block, a first hinge shaft is provided at one end of the first connecting piece, and the first hinge shaft is provided in the first groove, so that one end of the first connecting piece is slidably connected to the first hinge block.

3. The foldable LED display screen according to claim 2, wherein a second groove is provided on the first hinge block, a second hinge shaft is provided at one end of the second connecting piece, and the second hinge shaft is provided in the second groove, so that one end of the second connecting piece is slidably connected to the second hinge block.

4. The foldable LED display screen according to claim 1, wherein the first connecting piece is provided with a first arm and a second arm, the first arm is integrally formed with the second arm, the first arm and the second arm are rotatably connected to the hinge shaft, and an angle between the first arm and the second arm is greater than 90°.

5. The foldable LED display screen according to claim 4, wherein the second connecting piece is provided with a third arm and a fourth arm, the third arm is integrally formed with the fourth arm, a connecting part between the third arm and the fourth arm is rotatably connected to the hinge shaft, and an angle between the third arm and the fourth arm is greater than 90°.

6. The foldable LED display screen according to claim 1, wherein the first connecting end is provided with a first adsorption piece, the second connecting end is provided with a second adsorption piece, and when the first display screen and the second display screen are unfolded, the first adsorption piece is adsorbed to the second adsorption piece.

7. The foldable LED display screen according to claim 1, further comprising:
a fixing piece,
wherein the first display screen is fixed to the second display screen through the fixing piece.

8. The foldable LED display screen according to claim 1, wherein at least one of the first connecting end and the second connecting end is provided with a buffer.

9. The foldable LED display screen according to claim 1, wherein a positioning structure is provided between the first connecting end and the second connecting end, so that the first display screen is fixed to the second display screen.

10. The foldable LED display screen according to claim 9, wherein one of the first connecting end and the second connecting end is provided with a positioning column, and another one of the first connecting end and the second connecting end is provided with a positioning pin adapted to the positioning column.

11. The foldable LED display screen according to claim 1, wherein a locking structure is provided between the first connecting end and the second connecting end.

* * * * *